United States Patent
Sporer et al.

(10) Patent No.: US 9,941,185 B2
(45) Date of Patent: Apr. 10, 2018

(54) VARIABLE HEAT CONDUCTOR

(71) Applicant: GE Intelligent Platforms, Inc., Charlottesville, VA (US)

(72) Inventors: Bernd Sporer, Bavaria (DE); Philipp Gerhard Hortmann, Bavaria (DE)

(73) Assignee: GE Intelligent Platforms, Inc, Charlottesville, VA (US)

( * ) Notice: Subject to any disclaimer, the term of this patent is extended or adjusted under 35 U.S.C. 154(b) by 0 days.

(21) Appl. No.: 15/022,108

(22) PCT Filed: Sep. 20, 2013

(86) PCT No.: PCT/US2013/060947
§ 371 (c)(1),
(2) Date: Mar. 15, 2016

(87) PCT Pub. No.: WO2015/041682
PCT Pub. Date: Mar. 26, 2015

(65) Prior Publication Data
US 2016/0233143 A1    Aug. 11, 2016

(51) Int. Cl.
*H01L 23/34* (2006.01)
*H01L 23/373* (2006.01)
(Continued)

(52) U.S. Cl.
CPC ...... *H01L 23/3735* (2013.01); *H01L 21/4882* (2013.01); *H01L 23/367* (2013.01);
(Continued)

(58) Field of Classification Search
CPC ......... H01L 2924/0002; H01L 2924/00; H01L 21/4882; H01L 23/367; H01L 23/3677; H01L 23/373; H01L 23/3735
(Continued)

(56) References Cited

U.S. PATENT DOCUMENTS 2,623,137 A    12/1952  Vogelsberg
2,673,444 A    3/1954   Clapp
(Continued)

FOREIGN PATENT DOCUMENTS

CH    232754 A     6/1944
DE    1107322 B    5/1961
(Continued)

OTHER PUBLICATIONS

Valalaki et al., "Low Thermal Conductivity Porous Si at Cryogenic Temperatures for Cooling Applications", Journal of Physics D: Applied Physics, vol. No. 46, Issue No. 29, pp. 9, Jun. 2013.
(Continued)

*Primary Examiner* — Duy T Nguyen
(74) *Attorney, Agent, or Firm* — GE Global Patent Operation; Scott R. Stanley (57) ABSTRACT

A method and apparatus for a variable heat conductor that is able to increase heat conduction capacity based on operating temperature. The variable heat conductor is to be positioned between an electronic device and a heat sink to facilitate cooling of the electronic device. During cold start-up of the electronic device, the variable heat conductor acts as a thermal isolator, causing the electronic device to warm more quickly following the cold start-up. The variable heat conductor may fully conduct heat at higher temperatures that are at or above a desired temperature set-point.

7 Claims, 6 Drawing Sheets

(51) Int. Cl.
*H01L 23/367* (2006.01)
*H01L 21/48* (2006.01)

(52) U.S. Cl.
CPC ........ *H01L 23/3677* (2013.01); *H01L 23/373* (2013.01); *H01L 2924/0002* (2013.01)

(58) Field of Classification Search
USPC ........................................................ 257/720
See application file for complete search history.

(56) References Cited

U.S. PATENT DOCUMENTS

| | | | |
|---|---|---|---|
| 4,809,133 A | 2/1989 | Faris et al. | |
| 5,679,457 A | 10/1997 | Bergerson | |
| 5,918,469 A | 7/1999 | Cardella | |
| 5,955,781 A | 9/1999 | Joshi et al. | |
| 2002/0128333 A1 | 9/2002 | Tang et al. | |
| 2003/0058619 A1 | 3/2003 | Morris et al. | |
| 2004/0016748 A1 | 1/2004 | Kinoshita et al. | |
| 2004/0084431 A1* | 5/2004 | Uhl | B60H 1/2225 219/201 |
| 2004/0251130 A1* | 12/2004 | Liu | H01J 37/34 204/298.01 |
| 2006/0158852 A1* | 7/2006 | Thomas | G06F 1/20 361/704 |
| 2009/0218087 A1 | 9/2009 | Oshima | |
| 2009/0279218 A1 | 11/2009 | Ferru | |
| 2010/0053907 A1 | 3/2010 | Soares et al. | |
| 2011/0176274 A1 | 7/2011 | Sevaekivi | |

FOREIGN PATENT DOCUMENTS

| | | |
|---|---|---|
| EP | 1395098 A1 | 3/2004 |
| GB | 790722 A | 2/1958 |
| JP | 6267842 A | 2/1987 |
| JP | 6235547 A | 3/1987 |
| JP | H0357989 U | 6/1991 |
| SU | 568831 A1 | 8/1977 |
| WO | 9316579 A1 | 8/1993 |
| WO | 9818302 A1 | 4/1998 |
| WO | 0011919 A1 | 3/2000 |

OTHER PUBLICATIONS

A PCT Search Report and Written Opinion issued in connection with corresponding Application No. PCT/US2013/060947 dated Jun. 4, 2014.

A Office Action issued in connection with corresponding JP Application No. 2016-544310 dated Jul. 11, 2017.

* cited by examiner

FIG. 1
(CONVENTIONAL)

DETAIL B

VARIABLE HEAT CONDUCTOR

CROSS REFERENCE TO RELATED APPLICATIONS

This application is a National Phase of International Application No. PCT/US2013/060947, filed Sep. 20, 2013, which is hereby incorporated by reference in its entirety.

BACKGROUND OF THE INVENTION

Field of the Invention

Example embodiments relate generally to cooling electronic devices, and more particularly to a method and apparatus for a variable heat conductor positionable between an electronic device and a heat sink to facilitate rapid warming of the electronic device during startup of the electronic device at low temperatures.

Related Art

Electronic devices, such as integrated circuits, processors, memory chips, field-programmable gate arrays (FPGA), logic chips, etc., generally require cooling in order to operate efficiently and effectively, especially at high temperatures. In order to facilitate such cooling, a conventional thermal stack-up 10 is often employed, as shown for instance in FIG. 1. The thermal stack-up 10 may include a heat conductor 4 in contact with an electronic device 2 and a heat sink 6. The heat conductor 4 is generally made from a material, such as a metal, that offers a high heat conductivity in order to efficiently conduct and transmit heat from the electronic device 2 to the heat sink 6. In particular, the heat conductor 4 absorbs thermal energy from the electronic device 2 via convection, radiation, and mostly notably conduction, and facilitates the transfer of this energy to the heat sink 6. Because conduction is the primary mode of the thermal energy transmission, the heat conductor 4 often directly contacts both the electronic device 2 and the heat sink 6.

Figure 1:
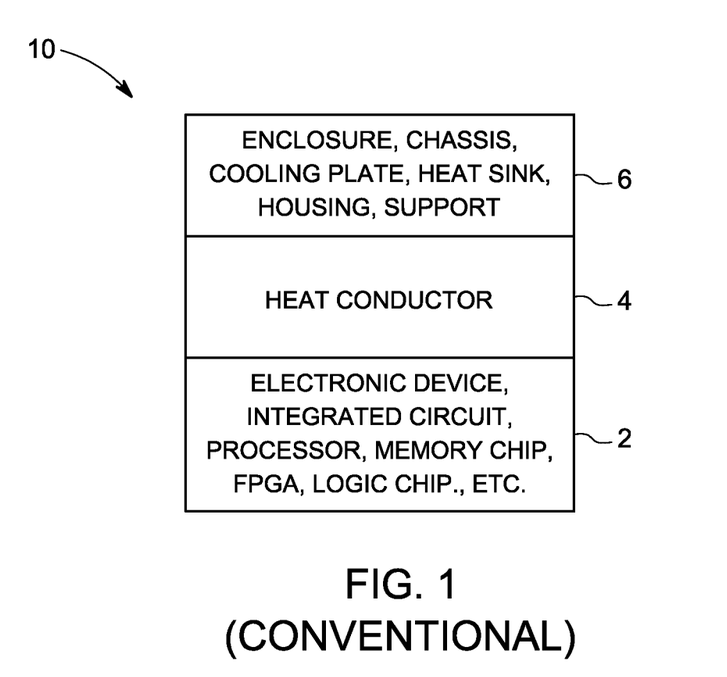
FIG. 1 is a simplified diagram of a conventional thermal stack-up.

The heat sink 6 often times takes the form of an enclosure, a cooling plate, a housing, a support, fins, ribs, or any other suitable structure that facilitates heat expulsion from the heat conductor 4.

Conventionally, a thermal stack-up 10 is effective in removing thermal heat from an electronic device 2, allowing the electronic device 2 to operate in an appropriate temperature operating range even at high ambient temperatures (or, even in confided spaces, where operation of the electronic device 2 may cause significant heat emission). However, while a conventional thermal stack-up 10 is effective in removing heat, this heat removal can be counterproductive during periods of electronic device 2 startup, especially when the startup occurs at low temperatures. The startup of ever more highly-integrated circuits, with services required to operate in wide temperature ranges (for instance, in temperature ranges between −40° C. and 85° C.), act to exacerbate startups at very low temperatures. For instance, conventional high-performance central processing units (CPUs) currently are not rated to be able to quickly turn-on at −40° C. Therefore, at very low temperatures, electronic devices 2 in a conventional thermal stack-up 10 may either take an exceptionally long period of time to startup, or the electronic devices 2 may not be able to turn-on and function, at all.

BRIEF DESCRIPTION OF INVENTION

Example embodiments provide a method and an apparatus for a variable heat conductor that is able to increase heat conduction capacity based on operating temperature. Specifically, the variable heat conductor may act as a thermal isolator at lower temperatures, and the variable heat conductor may fully conduct heat at higher temperatures that are at or above a desired temperature set-point.

BRIEF DESCRIPTION OF THE DRAWINGS

The above and other features and advantages of example embodiments will become more apparent by describing in detail, example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
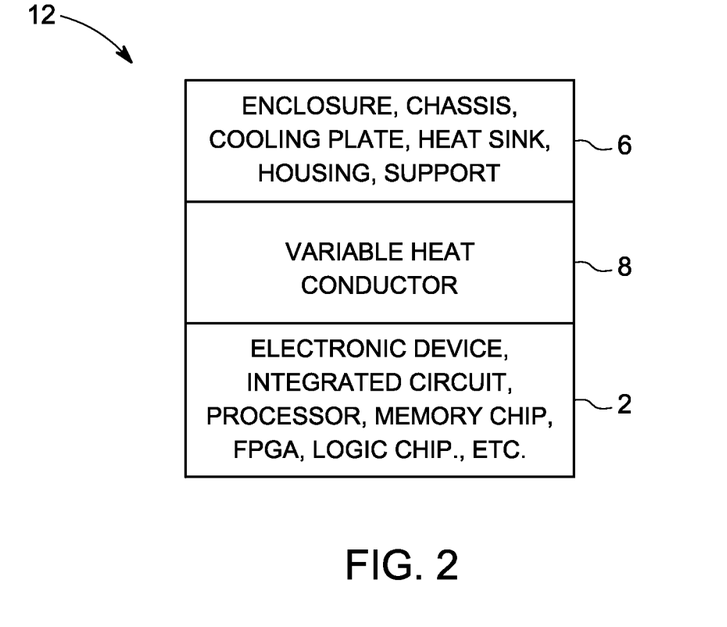
FIG. 2 is a simplified diagram of a thermal stack-up, in accordance with an example embodiment.

FIG. 2 is a simplified diagram of a thermal stack-up 12, in accordance with an example embodiment. The stack-up 12 is similar to the conventional thermal stack-up 10 of FIG. 1. However, stack-up 12 utilizes a variable heat conductor 8 that acts as a thermal isolator at lower temperatures, and fully conducts heat at higher temperatures that are at or above a desired temperature set-point, as described in detail herein.

Figure 3:
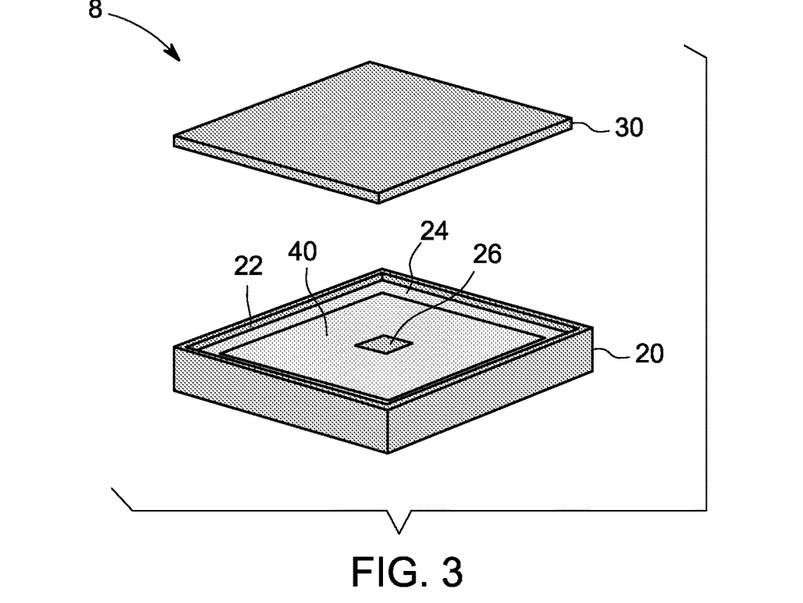
FIG. 3 is a detailed view of a variable heat conductor, in accordance with an example embodiment.
Figure 6:
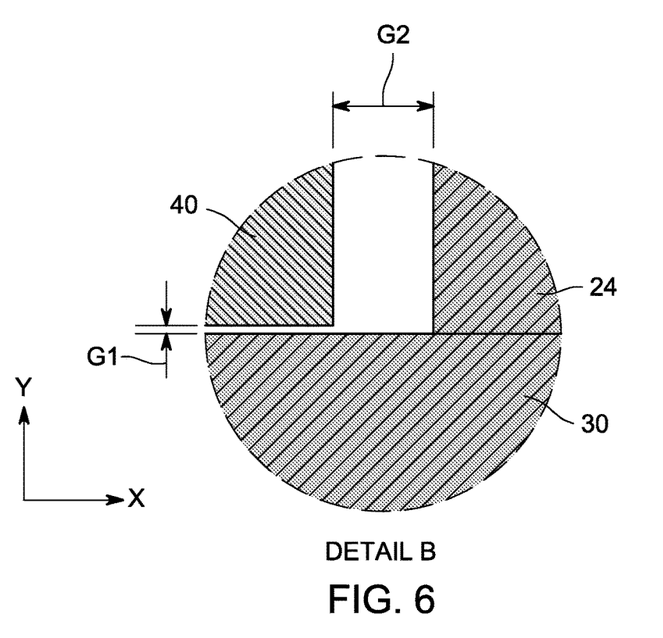
FIG. 6 is a magnified view of detail B of FIG. 6, in accordance with an example embodiment.

FIG. 3 is a detailed view of a variable heat conductor 8, in accordance with an example embodiment. The heat conductor 8 may conic in two major parts that may include a main body 20 and a lid 30. While FIG. 3 depicts the main body 20 in the shape of a square, the main body 20 may be formed of any shape. The main body 20 may include a lip 22 capable of securely retaining lid 30. The main body 20 may include a till material 24, and a post 26, with an upper surface of the fill material 24 and the post 26 existing at the same elevation. A high-thermal-expansion material 40 may be anchored to the main body 20. An upper surface of the high-thermal-expansion material 40 may exist at an elevation that is slightly lower than the elevation of the fill material 24 and post 26, in order to account for the thermal expansion of the high-thermal-expansion material 40 (this difference in elevation is best depicted in FIG. 6).

The high-thermal-expansion material 40 may be formed from a material that is different from a material that is used to form the remainder of the variable heat conductor 8. That is to say, the lid 30, the lip 22, the fill material 24 and post 26 of the heat conductor 8 may be formed of one common material (indicated as Material A in Table 1, below), whereas the high-thermal-expansion material 40 may be formed from a different material (indicated as Material B in Table 1, below). As shown in Table 1, Material A includes materials with lower thermal expansion coefficients ($\alpha$) relative to the materials listed as Material B.

TABLE 1

| | Linear Expansion $\alpha$ ($10^{-6}$/K) | Thermal Conductivity $\lambda$ (W/mK) |
|---|---|---|
| Material A | | |
| Diamond | 1.3 | 2300 |
| Copper | 16.8 | 380 |
| Material B | | |
| Aluminum | 23.8 | 180 |
| Indium | 56 | 82 |

Figure 9:
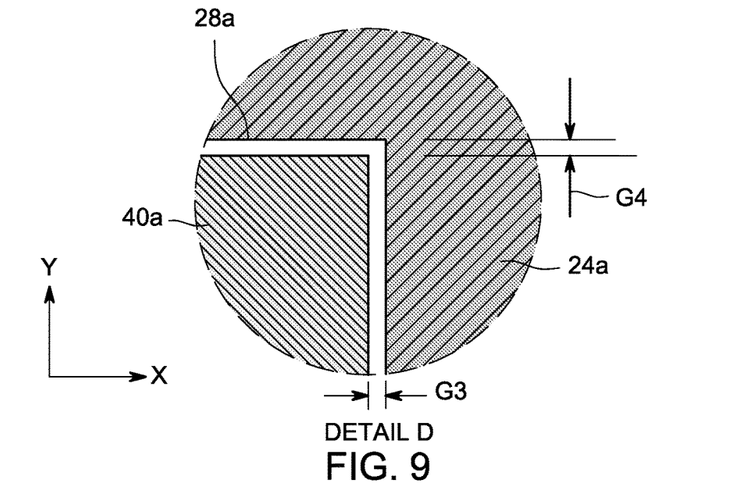
FIG. 9 is a magnified view of detail D of FIG. 8, in accordance with an example embodiment.

Table 1 is a non-exhaustive list of potential materials for the variable heat conductor. Due to the differences in thermal expansion between Material A and Material B, the materials listed as Material B experience a greater change in length per increment of temperature change (see the formula for linear expansion in Equation 1, below).

$$\Delta l = l_0 \cdot \alpha \cdot \Delta t \qquad \text{Equation 1}$$

wherein $\Delta l$=change in length of a material
$l_0$=an original length of the material.
$\alpha$=the linear thermal expansion of the material
$\Delta t$=change in temperature It is important to note that variable heat conductors will perform more effectively when Material A and Material B possess a greater disparity in thermal expansion. This is because materials with a greater disparity in thermal expansion will experience a greater disparity in thermal growth (relative to each other) over a given temperature range, causing gaps within the heat conductor to close at a more precisely determined temperature (see the gaps in FIGS. 6 and 9), as described herein in more detail. Therefore, a heat conductor formed from Diamond and Indium will perform more effectively than a heat conductor formed from Aluminum and Copper, using the example materials shown in Table 1.

It should also be understood that the heat conductor 8 components made from Material A (as described above) may also be made from more than one material. Likewise, the heat conductor 8 components made from Material 13 (also described above) may also be made from more than one material. The only requirement for material selection is that the Material B components are formed from a material possessing a greater rate of thermal expansion as compared to the Material A components.

Figure 4:
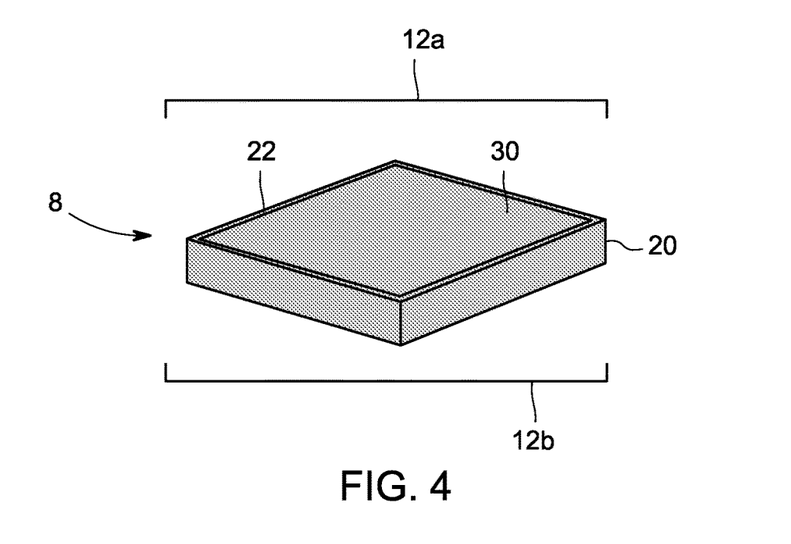
FIG. 4 is a view of the fully-assembled variable heat conductor of FIG. 3, in accordance with an example embodiment.

FIG. 4 is a view of the fully-assembled variable heat conductor 8 of FIG. 3, in accordance with an example embodiment. As shown in FIG. 4, the lid 30 of heat conductor 8 has been pressed into the top of main body 20, where lid 30 is being held in place by lip 22. In the full-assembled configuration, heat conductor 8 includes two major surfaces, major surface 12a (on top of the heat conductor) and major surface 1213 (below the heat conductor). When inserted into thermal stack-up 12 (FIG. 2), one of the major surfaces 12a/12b of heat conductor 8 may be positioned to contact heat sink 6, and the other major surface 12a/12b may be positioned to contact electronic device 2. While the heat conductor 8 may operate more effectively when major surface 12b is contacting the electronic device 2 (as the high-thermal-expansion material 40 is anchored to the bottom of main body 20, allowing heat transmission from electronic device 2 directly to high-thermal-expansion material 40 via conduction), the heat conductor 8 will operate adequately in either configuration.

Figure 5:
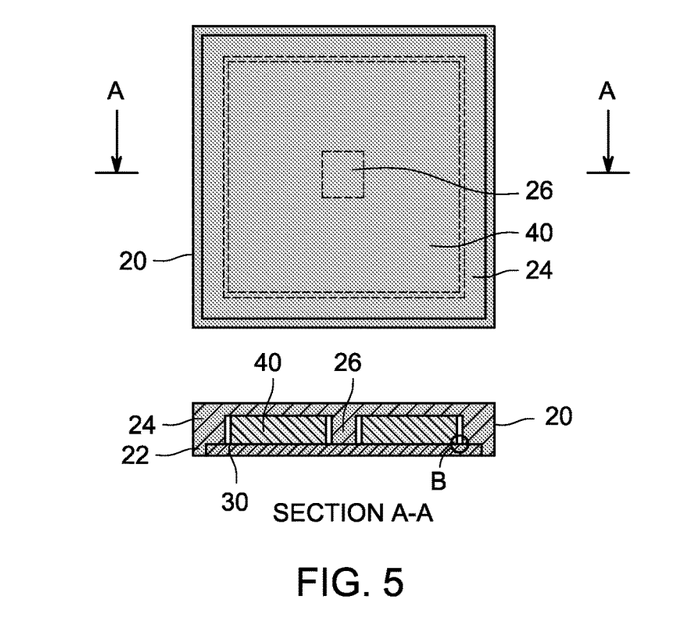
FIG. 5 is an overhead and cross-sectional view of the fully-assembled variable heat conductor of FIG. 4, in accordance with an example embodiment.

FIG. 5 is an overhead and cross-sectional view of the fully-assembled variable heat conductor 8 of FIG. 4, in accordance with an example embodiment. The overhead view more clearly depicts the layout of the fill material 24 and post 26 locations relative to the high-thermal-expansion material 40. Cross-section A-A more clearly depicts lid 30 being retained by lip 22 of main body 20.

FIG. 6 is a magnified view of detail B of FIG. 6, in accordance with an example embodiment. In particular, detail B identifies gaps G1/G2 between components of heat conductor 8, which account for the disparity in thermal expansion between the Material A and Material B materials. Specifically, gap G1 is a small gap that is provided between high-thermal-expansion material 40 and an inner surface of lid 30. This gap G1 accounts for growth in the length of high-thermal-expansion material 40 in an y-axis direction. Gap G2 is also provided between fill material 24 and high-thermal-expansion material 40, accounting for growth in the length of high-thermal-expansion material 40 in a x-axis direction (gap G2 being purposefully larger than gap G1, as high-thermal-expansion material 40 has a greater length in the x-axis direction).

FIG. 6 depicts gaps G1/G2 in a state in which the temperature of heat conductor 8 is relatively cool. A precise determination of the size of gap G1 may be determined (via Equation 1) to ensure that the gap G1 may close at a desired temperature set-point. That is to say, as heat conductor 8 is warmed within thermal stack-up 12 (as electronic device 2 experiences startup, at a relatively cold temperature, and begins to emit heat energy), gap G1 will begin to narrow and eventually close. Therefore, an optimally sized gap G1 will close at the desired temperature set-point, ensuring that heat conductor 8 will begin to fully conduct heat energy at or above the desired temperature set-point (as high-thermal-expansion material 40 expands and fully contacts the inner surface of lid 30). Because gap G1 exists in a plane that intersects an expected direction of heat transmission through conductor 8, the closing of gap G1 will facilitate heat conduction through conductor 8. Furthermore, if gap G1 is approximately perpendicular to the shortest distance of travel for heat transmission from electronic device 2 to heat sink 6 (i.e., gap G1 exists in a plane along the x-axis), gap G1 will offer the greatest efficiency of heat conduction (as gap G1 transitions from an open to closed position).

Gap G2 is provided to allow high-thermal-expansion material 40 to also grow in the x-axis direction. Because gap G2 is defined to exist at an angle that is approximately parallel to the flow of heat transmission from electronic device 2 to heat sink 6 (i.e., gap G2 exists in a plane along the y-axis), gap G2 therefore does not necessarily need to be sized to close precisely at the desired temperature set-point. This is because the closing of gap G2 is not as critical to the transmission of heat.

Figure 7:
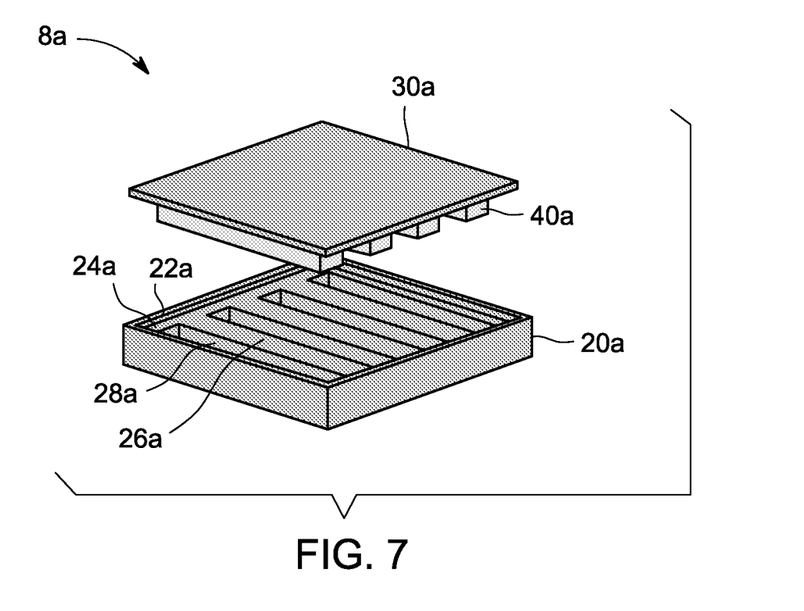
FIG. 7 is a detailed view of another variable heat conductor, in accordance with an example embodiment.

FIG. 7 is a detailed view of another variable heat conductor 8a, in accordance with an example embodiment. Heat conductor 8a includes a main body 20a with a lid 30a. The lid 30a may include strips 40a made from a high-thermal-expansion material that are anchored to an inner surface of the lid 30a. The main body 20a may include a fill material 24a with ribs 26a that define slots 28a sized to accept accommodate the high-thermal-expansion material strips 40a when fully assembled. Lip 22a may be provided to retain lid 30a when lid 30a is placed on main body 20a.

Similar to heat conductor 8 (FIG. 3), the components of heat conductor 8a (FIG. 7) may be formed from two materials, identified as Material A and Material B, respectively, as listed in the non-exhaustive list of potential materials, shown in Table 1. Specifically, the high-thermal-expansion material strips 40a may be formed from Material B, whereas all other components (lid 30a, main body 20a, lip 22a, fill material 24a and ribs 26a) may be formed from Material A.

Figure 8:
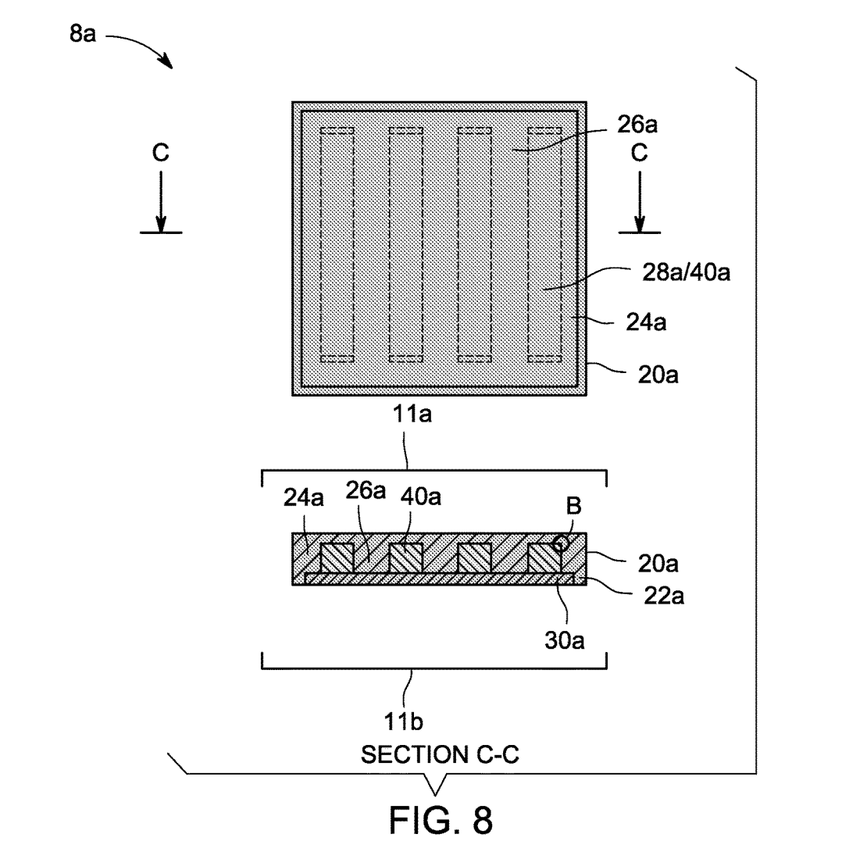
FIG. 8 is an overhead and cross-sectional view of the fully-assembled variable heat conductor of FIG. 7, in accordance with an example embodiment.

FIG. 8 is an overhead and cross-sectional view of the fully-assembled variable heat conductor 8a of FIG. 7, in accordance with an example embodiment. The overhead view more clearly depicts the layout of the slots 28a housing strips 40a. Cross-section C-C more clearly depicts lid 30a being retained by lip 22a of main body 20a. Heat conductor 8a may be inserted into thermal stack-up 12 (FIG. 2) such that one of major surfaces 11a/11b of heat conductor 8a may directly contact electronic device 2, whereas the other of the major surfaces 11a/11b may directly contact heat sink 6 (with a preference for major surface 11b contacting electronic device 2, as the high-thermal-expansion material strips 40a are anchored on lid 30a, allowing a direct transmission of conductive heat energy from electronic device 2 to the high-thermal-expansion material strips 40a).

FIG. 9 is a magnified view of detail D of FIG. 8, in accordance with an example embodiment. Gap G4 purposefully exists along a plane that is perpendicular to the direct path of energy transmission from electronic device 2 to heat sink 6 (i.e., gap G4 exists in a plane along the x-axis). Therefore, gap G4 may be sized to close at a desired temperature set-point (allowing high-thermal-expansion material strips 40a to frilly contact a bottom surface of slots 28a), in order to maximize heat conduction efficiency at the desired temperature set-point. Because gap G3 exists in a plane that is parallel to the transmission of heat energy (i.e., the y-axis), gap G3 does not necessarily need to be designed to close precisely at the desired temperature set-point. Instead, gap G3 is to be sized simply to allow extra room for the thermal expansion of the high-thermal-expansion material strips 40a in the x-axis direction with each slot 28a.

Figure 10:
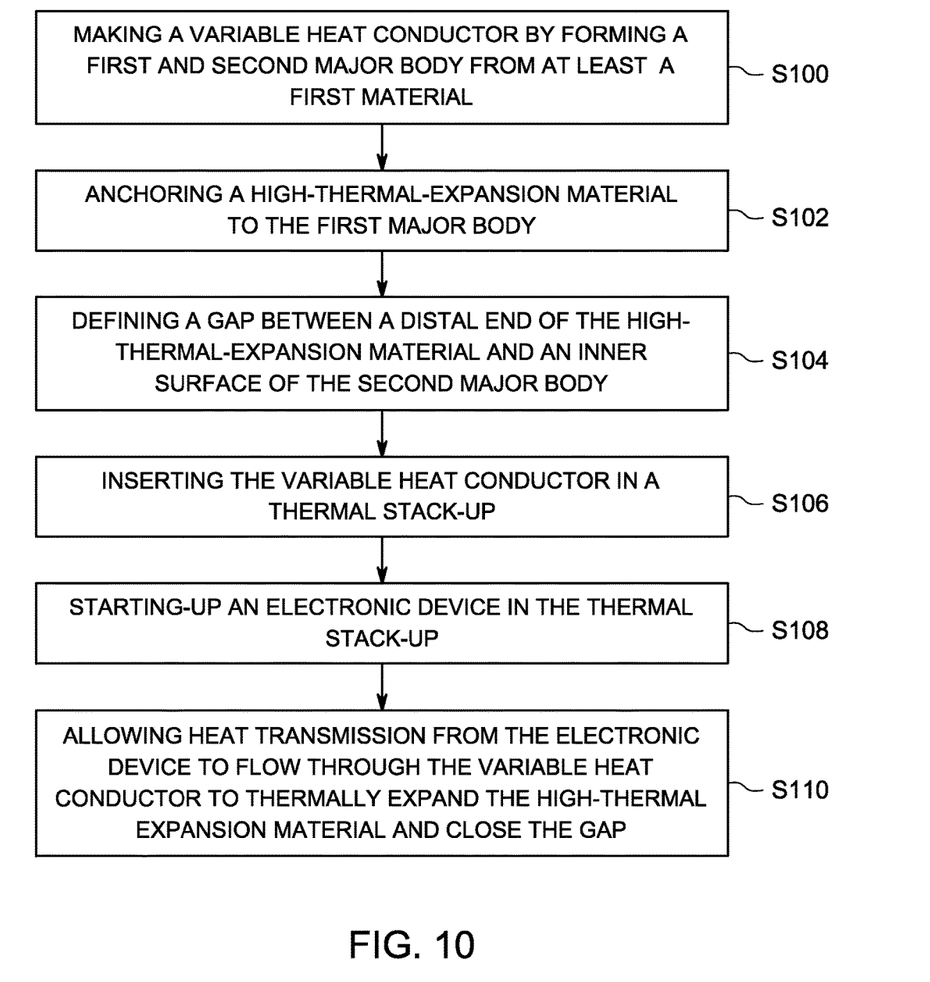
FIG. 10 is a flowchart of a method of making and using a variable heat conductor, in accordance with an example embodiment.

FIG. 10 is a flowchart of a method of making and using a variable heat conductor 8/8a, in accordance with an example embodiment. Specifically, step S100 may include making a variable heart conductor 8/8a by forming a first major body (such as the main body 20 of FIG. 3, or the lid 30a of FIG. 7) and a second major body (such as lid 30, or main body 20a) from at least a first material. The first material may be a material listed as Material A (shown in Table 1).

Both the first/second major bodies may be formed of any shape which may be appropriate in order to cool an electronic device 2. For instance, if the electronic device 2 is a large square-shaped device, the first/second major bodies may be in the form of a square shape that may be conformed to a side surface of the electronic device 2. A depth/thickness of the first/second major bodies may vary, depending on the type of service (which may include the expected/desired amount of heat removal for the electronic device 2, the temperature of a heat sink 6, the materials chosen for the heat conductor 8/8a, etc.). It should also be understood that more than one material may be used to make the first and/or second major bodies.

Step S102 may include anchoring a high-thermal-expansion material 40/40a to the first major body 20/30a. The anchoring may be accomplished via welding, fasteners, adhesive, or any other suitable means of firmly affixing the high-thermal-expansion material 40/40a to the first major body 20/30a. The high-thermal-expansion material 40/40a may be a material listed as Material B (shown in Table 1). However, other materials, besides the materials listed in Table 1, may also be used in order to make the high-thermal-expansion material 40/40a and the first second major bodies of the heat conductor 8/8a, so long as the high-thermalexpansion material 40/40*a* is made from a material that offers greater thermal expansion as compared to the material(s) for the first and/or second major bodies.

Step S104 may include defining a gap G1/G4 between a distal end of the high-thermal-expansion material 40/40*a* and an inner surface of the second major body 30/20*a*. The gap G1/G4 may exist in a plane that is about perpendicular to an expected direction of heat transmission through the heat conductor 8/8*a*, in order to maximize the efficiency of the heat conductor 8/8*a*. This gap G1/G4 is to be designed to account for thermal expansion of the high-thermal-expansion material 40/40*a* (which will thermally expand at a greater rate than the Material A portions of the heat conductor 8/8*a*) in the expected direction of heat transmission through heat conductor 8/8*a*. In particular, a determination of a length of gaps G1/G4 may be calculated via Equation 1 (above) to ensure that the gaps G1/G4 close at a desired temperature set-point. That is to say, the length of the gap is determined in order to account for growth of the high-thermal-expansion material 40/40*a*, which will be experienced as a temperature of the heat conductor 8/8*a* changes between a cold start-up temperature of the electronic device 2 and the desired temperature set-point of the electronic device 2.

The desired temperature set-point may be a temperature set-point that is specific to the electronic device 2. That is to say, the desired temperature set-point may be a temperature that the electronic device 2 is rated to effectively operate at without any known performance problems.

Additional gaps G2/G3 may also be provided on lateral sides of the high-thermal-expansion material 40/40*a*, in order to account for the thermal expansion of the high-thermal-expansion material 40/40*a* in other directions that may be about perpendicular to the expected direction of heat transmission through heat conductor 8/8*a*.

Step S106 may include inserting the heat conductor 8/8*a* into a thermal stack-up 12. Specifically, the heat conductor 8/8*a* may be placed between the electronic device 2 and the heat sink 6. In order to maximize the effectiveness of heat transmission between the electronic device 2 and the heat sink 6, the heat conductor 8/8*a* may directly contact both the electronic device 2 and the heat sink 6 (in order to maximize the amount of heat conduction through heat conductor 8/8*a*), though the direct contact of the heat conductor 8/8*a* with either the electronic device 2 and/or the heat sink 6 is not mandatory (as the heat conductor 8/8*a* may still transmit heat that is absorbed and/or transmitted via convection radiation, as opposed to conduction). The heat conductor 8/8*a* may be positioned between the electronic device 2 and heat sink 6 by ensuring that the gaps G1/G4 are positioned to exist in a plane that is about perpendicular to an expected direction of heat transmission through the heat conductor 8/8*a*, in order to maximize the efficiency of the heat conductor 8/8*a*.

Step S108 may include stacking-up the electronic device 2 within the thermal stack-up 12. Because gaps G1/G4 exist in a plane that is perpendicular to the expected direction of heat transmission through the heat conductor 8/8*a*, the gaps G1/G4 will significantly reduce the amount of heat transmission flowing through the heat conductor 8/8*a* at temperatures which are below the desired temperature set-point. This allows heat conductor 8/8*a* to act as a thermal isolator at low temperatures (while electronic device 2 starts-up), allowing electronic device 2 to start-up more quickly and effectively than an electronic device 2 in a conventional thermal stack-up 10.

Step S110 may include allowing heat transmission from the electronic device 2 to flow through heat conductor 8/8*a*, causing the high-thermal-expansion material 40/40*a* to thermally expand at a greater rate than the Material A portions of heat conductor 8/8*a*. By allowing this heat transmission to flow through heat conductor 8/8*a*, and heat the heat conductor 8/8*a*, the gaps G1/G4 will then close at the desired temperature set-point. This will allow heat conductor 8/8*a* to fully conduct heat at higher temperatures (at or above the desired temperature set-point), when heat transmission from the electronic device 2 to heat sink 6 is necessary and desired.

This written description uses examples to disclose the invention, including the best mode, and also enables any person skilled in the art to practice the on, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A variable heat conductor, comprising:
   a first major body being made from a first material, the first major body defining a cavity surrounded by a lip and partially filled with a fill material adjacent the lip;
   a second major body being made from the first material, the second major body comprising a lid that is retained by the lip; and
   an expansion material having a higher rate of thermal expansion than the first material, the expansion material being anchored to the first major body and partially filling the cavity, the expansion material having an upper surface that is lower than an upper surface of the fill material, thereby defining a gap between the expansion material and the lid.

2. The variable heat conductor of claim 1, wherein the gap exists in a plane that intersects an expected direction of heat transmission through the variable heat conductor.

3. The variable heat conductor of claim 2, wherein a length of the gap corresponds to an expected length of thermal expansion of the expansion material.

4. The variable heat conductor of claim 3, wherein the expected length of thermal expansion is a length of growth of the expansion material between a start-up temperature and a desired temperature set-point.

5. A thermal stack-up, comprising:
   an electronic device;
   a heat sink; and
   the variable heat conductor according to claim 1, positioned between the electronic device and the heat sink.

6. The thermal stack-up of claim 5, wherein the variable heat conductor directly contacts the electronic device and the heat sink.

7. A variable heat conductor, comprising:
a lid being made from a first material;
a plurality of strips coupled to the lid, the plurality of strips being made of an expansion material having a higher rate of thermal expansion than the first material;
a main body being made from the first material, the main body comprising:
 a lip that receives the lid; and
 a fill material defining slots that receive the plurality of strips, the slots having a bottom surface;
wherein, when the lid is received by the lip, the plurality of strips do not contact the bottom surface of the slots at a first temperature, and wherein the plurality of strips contact the bottom surface of the slots at a second temperature that is higher than the first temperature.

* * * * *